US012804937B2

(12) United States Patent
Lin et al.

(10) Patent No.: US 12,804,937 B2
(45) Date of Patent: Nov. 17, 2026

(54) EPITAXIAL STRUCTURE WITH MULTIPLE BUFFER LAYERS FOR STRESS ADJUSTMENT AND HIGH-VOLTAGE RESISTANCE

(71) Applicant: GLOBALWAFERS CO., LTD., Hsinchu City (TW)

(72) Inventors: Po-Jung Lin, Hsinchu City (TW); Jia-Zhe Liu, Hsinchu City (TW); Hong-Che Lin, Hsinchu City (TW); Chih-Yuan Chuang, Hsinchu City (TW)

(73) Assignee: GLOBALWAFERS CO., LTD., Hsinchu City (TW)

( * ) Notice: Subject to any disclaimer, the term of this patent is extended or adjusted under 35 U.S.C. 154(b) by 423 days.

(21) Appl. No.: 18/510,046

(22) Filed: Nov. 15, 2023

(65) Prior Publication Data

US 2024/0170564 A1 May 23, 2024

Related U.S. Application Data

(60) Provisional application No. 63/426,504, filed on Nov. 18, 2022.

(51) Int. Cl.

*H10D 30/47* (2025.01)
*H10D 62/824* (2025.01)
*H10D 62/85* (2025.01)

(52) U.S. Cl.

CPC ....... *H10D 30/4732* (2025.01); *H10D 62/824* (2025.01); *H10D 62/8503* (2025.01)

(58) Field of Classification Search

CPC ........... H10D 30/4732; H10D 62/8503; H10D 62/824

(Continued)

(56) References Cited

U.S. PATENT DOCUMENTS 11,594,413 B2 * 2/2023 Chen .................. H10P 14/3252
2006/0118824 A1 * 6/2006 Otsuka ............... H10D 30/4755
257/E29.253

(Continued)

FOREIGN PATENT DOCUMENTS

CN 103066103 A 4/2013
JP 2019-47113 A 3/2019

(Continued)

OTHER PUBLICATIONS

Search Report issued in Taiwan priority application 112102931, dated Jul. 19, 2023.

*Primary Examiner* — Phuc T Dang

(74) *Attorney, Agent, or Firm* — Birch, Stewart, Kolasch & Birch, LLP

(57) ABSTRACT

An epitaxial structure includes a substrate, a first buffer layer, a second buffer layer, and a channel layer, wherein the first buffer layer is located on a top of the substrate and includes a first portion. The first portion includes a nitride, which is ternary and above, and an aluminum atom concentration of the first portion is less than or equal to 25 at %. The first portion has an element doping, wherein a doping concentration of the element doping of the first portion is greater than or equal to $1\times10^{18}$ $cm^{-3}$. The second buffer layer is located on a top of the first buffer layer. The second buffer layer is provided without aluminum and has an element doping. The channel layer is located on a top of the second buffer layer.

23 Claims, 7 Drawing Sheets

(58) Field of Classification Search
USPC .......................................................... 257/194
See application file for complete search history.

(56) References Cited

U.S. PATENT DOCUMENTS

| | | | |
|---|---|---|---|
| 2013/0099243 A1 | 4/2013 | Chen et al. | |
| 2021/0057562 A1 | 2/2021 | Hsieh et al. | |
| 2021/0336011 A1 * | 10/2021 | Lin ...................... | H10D 62/824 |
| 2022/0328680 A1 | 10/2022 | Chou et al. | |

FOREIGN PATENT DOCUMENTS

| | | | |
|---|---|---|---|
| TW | 202017187 A | 5/2020 | |
| WO | WO-2014198550 A1 * | 12/2014 | .......... H10P 14/3416 |

* cited by examiner

EPITAXIAL STRUCTURE WITH MULTIPLE BUFFER LAYERS FOR STRESS ADJUSTMENT AND HIGH-VOLTAGE RESISTANCE

CROSS REFERENCE TO RELATED APPLICATIONS

This non-provisional application claims the benefit under 35 U.S.C. § 119 (e) to U.S. Provisional Application No. 63/426,504, filed on Nov. 18, 2022, which is hereby expressly incorporated by reference into the present application.

BACKGROUND OF THE INVENTION

Technical Field

The present invention relates generally to an epitaxial structure, and more particularly to an epitaxial structure with a stress adjustment and an enhanced voltage resistance.

Description of Related Art

It is known that a High Electron Mobility Transistor (HEMT) is a transistor having a two-dimensional electron gas (2-DEG), wherein the two-dimensional electron gas is located close to a heterojunction of two materials with different energy gaps. As the HEMT makes use of the 2-DEG having a high electron mobility as a carrier channel of the transistor instead of a doped region, the HEMT has features of a high breakdown voltage, the high electron mobility, a low on-resistance, and a low input capacitance, thereby being widely applied to a high power semiconductor device.

Generally, a buffer layer which contains aluminum without doping is disposed on a top of a substrate of the HEMT to adjust stress. However, the conventional buffer layer which contains aluminum without doping has a poor performance of voltage resistance. As a result, how to provide an epitaxial structure with a stress adjustment and an enhanced voltage resistance is a problem needed to be solved.

BRIEF SUMMARY OF THE INVENTION

In view of the above, the primary objective of the present invention is to provide an epitaxial structure, which could provide an effect of a stress adjustment and an enhanced voltage resistance.

The present invention provides an epitaxial structure including a substrate, a first buffer layer, a second buffer layer, and a channel layer, wherein the first buffer layer is located on a top of the substrate and includes a first portion. The first portion includes a nitride which is ternary or above: an aluminum atom concentration of the nitride of the first portion is less than or equal to 25 at %; the first portion has an element doping, wherein a doping concentration of the element doping of the first portion is greater than or equal to $1\times10^{18}$ $cm^{-3}$. The second buffer layer is located on a top of the first buffer layer, wherein the second buffer layer is provided without aluminum and has an element doping. The channel layer is located on a top of the second buffer layer.

In an embodiment, the first portion is in contact with the second buffer layer.

In an embodiment, the first buffer layer includes a second portion located between the substrate and the first portion, wherein two opposite sides of the second portion are respectively in contact with the substrate and the first portion. An aluminum atom concentration of the second portion is greater than 25 at %.

In an embodiment, a ratio of a thickness of the first buffer layer to a thickness of the second buffer layer is greater than or equal to 1.5 and is less than or equal to 10.

In an embodiment, a doping element of the first portion is carbon, iron, or magnesium.

In an embodiment, the epitaxial structure includes an intermediate buffer layer located between the first buffer layer and the second buffer layer, wherein two opposite sides of the intermediate buffer layer are respectively in contact with the first buffer layer and the second buffer layer. An aluminum atom concentration of the intermediate buffer layer is greater than or equal to 50 at %. A thickness of the intermediate buffer layer is less than or equal to 10 nm.

In an embodiment, the first portion includes at least one nitride film structure which has the nitride.

In an embodiment, the first portion includes a superlattice layer; the superlattice layer includes at least one ternary or above nitride film and at least one binary nitride film which are alternatively stacked, wherein the at least one ternary or above nitride film has the nitride.

In an embodiment, the first portion includes at least one intermediate layer; an aluminum atom concentration of the at least one intermediate layer is greater than or equal to 50 at %. A thickness of the at least one intermediate layer is less than or equal to 10 nm. The at least one intermediate layer and the at least one nitride film structure are alternatively stacked.

In an embodiment, when a current value of the epitaxial structure is equal to $1\times10^{-4}$ A/$cm^2$, a value of a vertical voltage resistance of the epitaxial structure is greater than or equal to 900 V.

In an embodiment, a distribution of the aluminum atom concentration of the nitride, which is ternary or above, of the first buffer layer gradually decreases in a direction away from the substrate starting from a side of the first buffer layer being in contact with the substrate.

With the aforementioned design, the first portion includes the nitride, which is ternary or above, and the aluminum atom concentration of the nitride of the first portion is less than or equal to 25 at % and the first portion has the element doping and the doping concentration of the element doping is greater than or equal to $1\times10^{18}$ $cm^{-3}$, so that adjusting stress and greatly enhancing a performance of voltage resistance of the epitaxial structure could be achieved.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
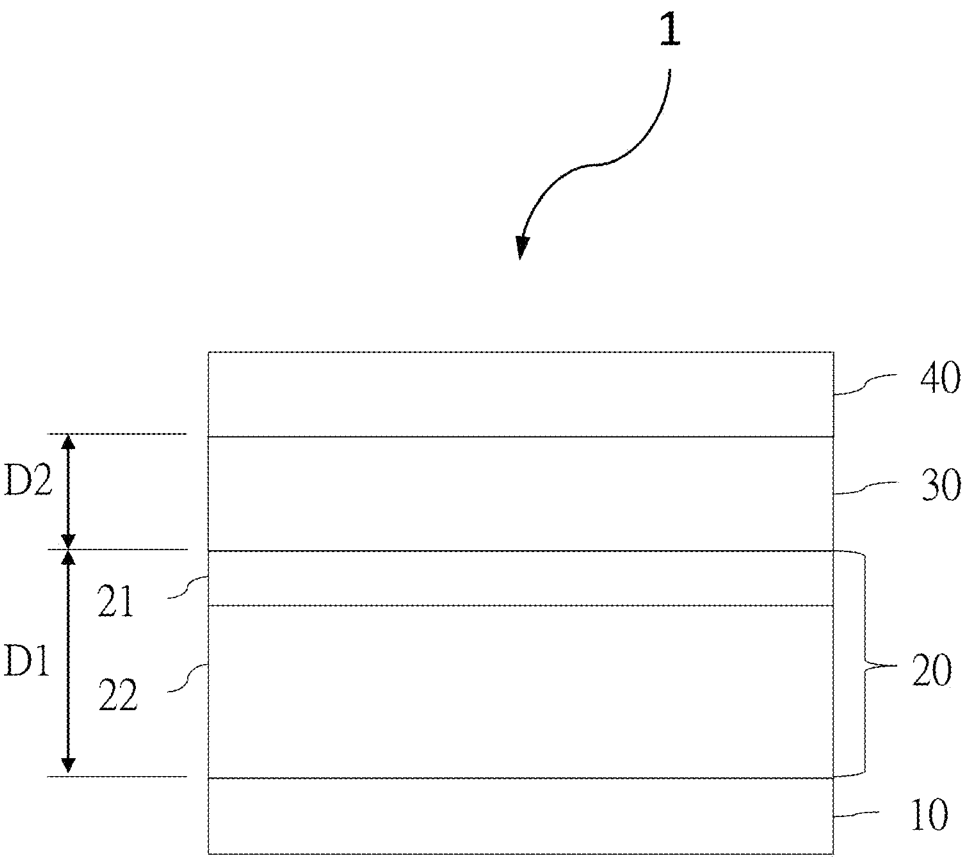
FIG. 1 is a schematic view of the epitaxial structure according to an embodiment of the present invention.

An epitaxial structure 1 according to an embodiment of the present invention is illustrated in FIG. 1, is applied to a High Electron Mobility Transistor (HEMT), and could be deposited to form by metal-organic chemical vapor deposition (MOCVD).

Referring to FIG. 1, the epitaxial structure 1 includes a substrate 10, a first buffer layer 20, a second buffer layer 30, and a channel layer 40, wherein the first buffer layer 20 is located on a top of the substrate 10 and includes a first portion 21. The first portion 21 includes a nitride which is ternary or above, wherein an aluminum atom concentration of the nitride of the first portion 21 is less than or equal to 25 at %. The first portion 21 has an element doping, wherein a doping concentration of the element doping of the first portion 21 is greater than or equal to $1\times10^{18}$ $cm^{-3}$. The second buffer layer 30 is located on a top of the first buffer layer 20, is provided without aluminum, and has an element doping. The channel layer 40 is located on a top of the second buffer layer 30. In this way, the first portion 21 includes the nitride, which is ternary or above, and the aluminum atom concentration of the nitride of the first portion 21 is less than or equal to 25 at % and the first portion 21 has the element doping and the doping concentration of the element doping is greater than or equal to $1\times10^{18}$ $cm^{-3}$, so that adjusting stress and greatly enhancing a performance of voltage resistance of the epitaxial structure 1 could be achieved.

A ratio of a thickness D1 of the first buffer layer 20 to a thickness D2 of the second buffer layer 30 is greater than or equal to 1.5 and less than or equal to 10, is preferably greater than or equal to 3 and less than or equal to 5, and is more preferably 5. In the current embodiment, the thickness D1 of the first buffer layer 20 is 4.5 um and the thickness D2 of the second buffer layer 30 is 1.5 um as an example.

In the current embodiment, the substrate 10 is a silicon substrate as an example for illustration. In other embodiments, the substrate 10 could be a silicon carbide (SiC) substrate or a sapphire substrate as an example. In the current embodiment, the nitride, which is ternary or above, is aluminum-gallium nitride ($Al_XGa_{1-X}N$) as an example: a doping element of the first portion 21 is carbon. In practice, the doping element of the first portion 21 could be iron or magnesium for example. Additionally, in the current embodiment, the second buffer layer 30 is a gallium nitride (GaN) layer which is doped with carbon as an example and could be a superlattice structure layer. In other embodiments, the nitride, which is ternary or above, could be indium gallium aluminum nitride (AlInGaN).

Referring to FIG. 1, in the current embodiment, the first portion 21 is in contact with the second buffer layer 30. In other words, after a growth of the first portion 21 is finished, the second buffer layer 30 is subsequently grown. The first buffer layer 20 includes a second portion 22 located between the substrate 10 and the first portion 21, wherein two opposite sides of the second portion 22 are respectively in contact with the substrate 10 and the first portion 21. In other words, the second portion 22 is first grown on the substrate 10 and then the first portion 21 is grown, wherein an aluminum atom concentration of the second portion 22 is greater than 25 at %. The second portion 22 includes a structure of $Al_XGa_{1-X}N$ as an example. The second portion 22 does not have an element doping.

Figure 2:
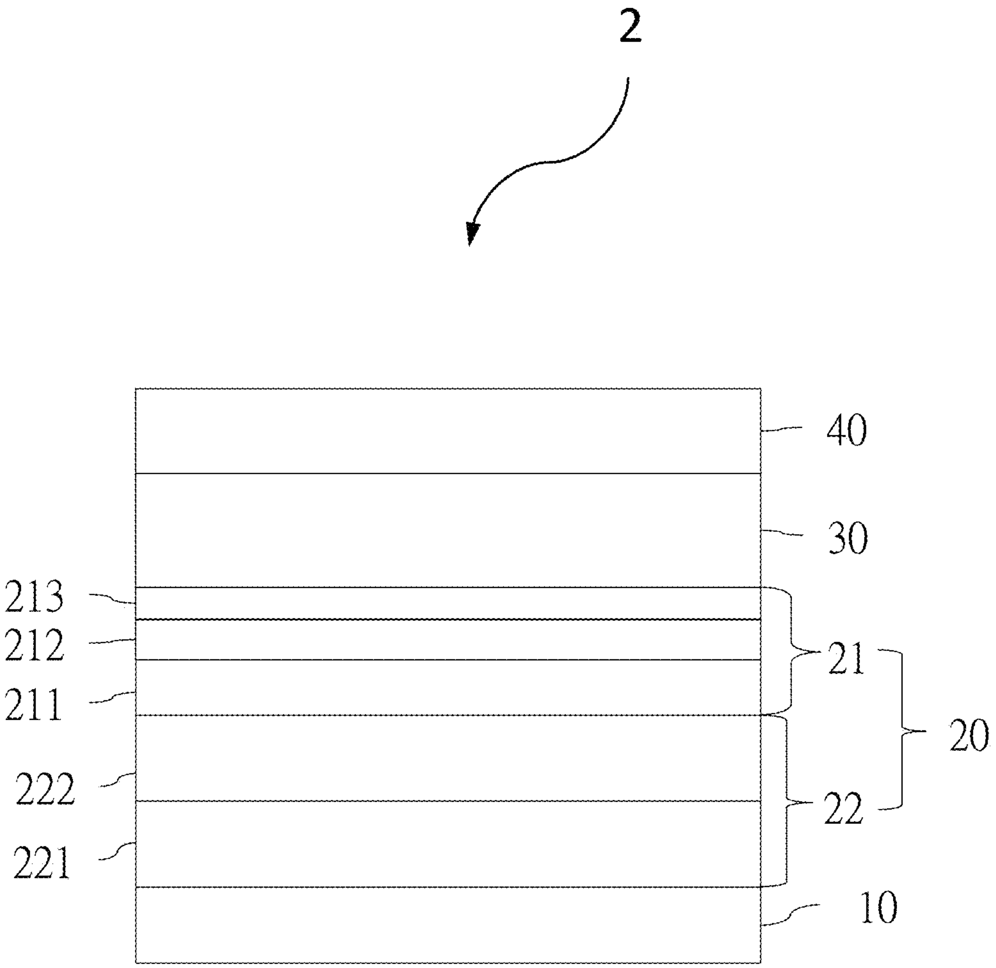
FIG. 2 is a schematic view of the epitaxial structure according to another embodiment of the present invention.

The first portion 21 includes at least one nitride film structure having the nitride which is ternary or above. In the current embodiment, the first portion 21 and the second portion 22 are respectively single-layer nitride film structures as shown in FIG. 1. In other embodiments, the first portion 21 or the second portion 22 could be respectively multi-layer nitride film structures. For instance, the multi-layer nitride film structure of the first portion 21 is at least one layer with an aluminum concentration which is less than or equal to 25% and could be three layers which are respectively with the aluminum concentration of 25%, 18%, and 7% as an example. As FIG. 2 shows an epitaxial structure 2, the first portion 21 includes a trilayer nitride film structure including a first aluminum-gallium nitride film structure 211 with an aluminum atom concentration of 25 at %, a second aluminum-gallium nitride film structure 212 with an aluminum atom concentration of 18 at %, and a third aluminum-gallium nitride film structure 213 with an aluminum atom concentration of 7 at %, wherein a carbon doping concentration of the first aluminum-gallium nitride film structure 211, a carbon doping concentration of the second aluminum-gallium nitride film structure 212, and a carbon doping concentration of the third aluminum-gallium nitride film structure 213 are all greater than or equal to $1\times10^{18}$ $cm^{-3}$. Additionally, as shown in FIG. 2, the second portion 22 could include a bilayer structure including a fourth aluminum-gallium nitride film structure 221 with an aluminum atom concentration of 75 at % and a fifth aluminum-gallium nitride film structure 222 with an aluminum atom concentration of 50 at %.

Figure 3:
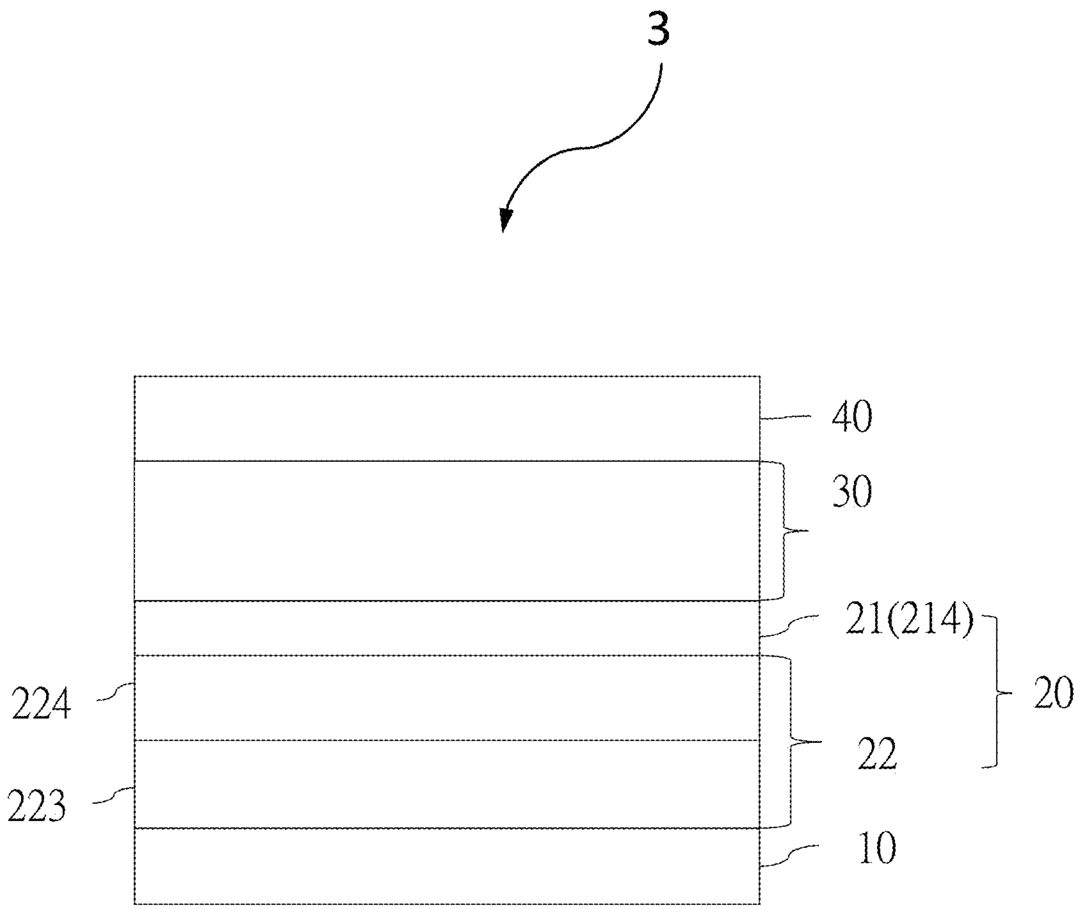
FIG. 3 is a schematic view of the epitaxial structure according to still another embodiment of the present invention.

Additionally, the first portion 21 or the second portion 22 could include a superlattice structure respectively, which enhances a performance stress adjustment. As FIG. 3 shows an epitaxial structure 3, the first portion 21 includes a superlattice layer 214. The superlattice layer 214 includes at least one ternary or above nitride film and at least one binary nitride film that are alternatively stacked, wherein the at least one ternary or above nitride film has the nitride, which is ternary or above, and could be a $Al_XGa_{1-X}N$ film with an aluminum atom concentration of 25 at %. The at least one binary nitride film could be an aluminum nitride (AlN) film.

Referring to FIG. 3, the second portion 22 of the epitaxial structure 3 includes two superlattice layers including a first superlattice layer 223 and a second superlattice layer 224. The first superlattice layer 223 includes a plurality of $Al_XGa_{1-X}N$ films and a plurality of AlN films which are alternatively stacked together, wherein an aluminum atom concentration of the $Al_XGa_{1-X}N$ films of the first superlattice layer 223 is 75 at %. The second superlattice layer 224 includes a plurality of $Al_XGa_{1-X}N$ films and a plurality of AlN films which are alternatively stacked together, wherein an aluminum atom concentration of the $Al_XGa_{1-X}N$ films of the second superlattice layer 224 is 50 at %.

Figure 4:
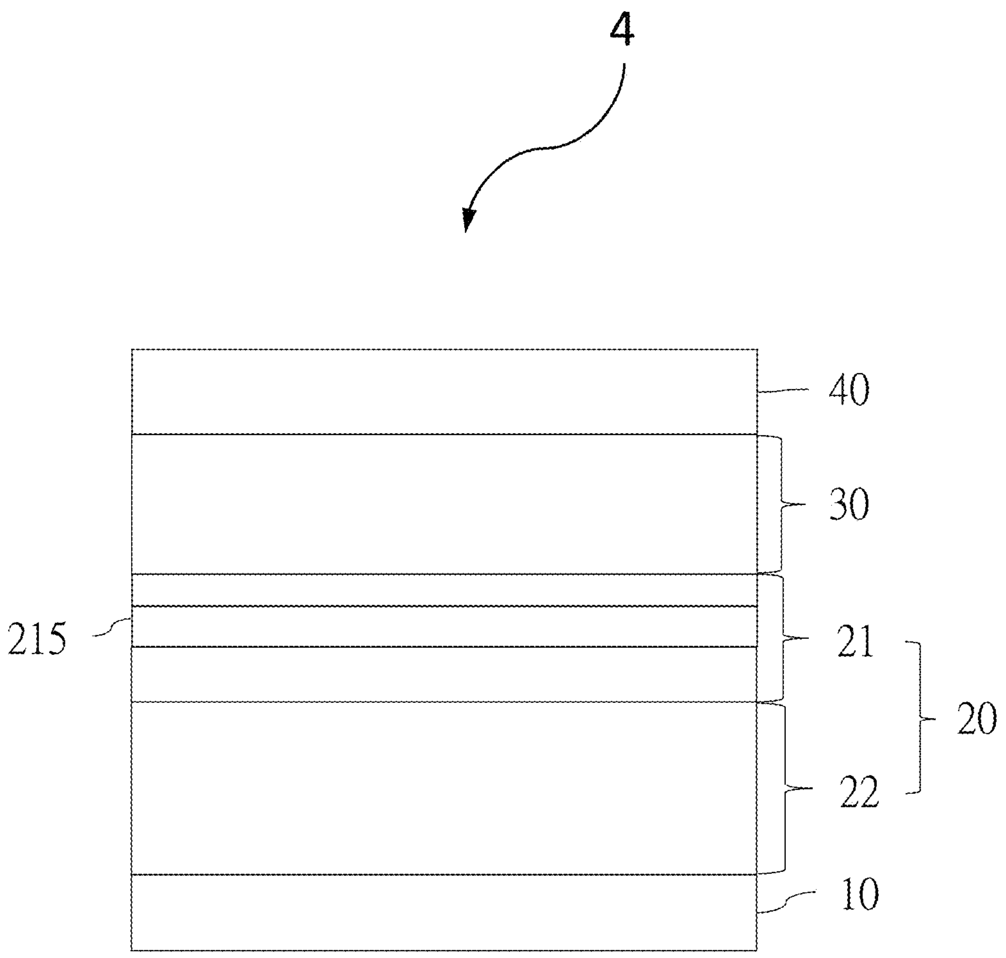
FIG. 4 is a schematic view of the epitaxial structure according to still another embodiment of the present invention.

In another embodiment, the first portion 21 of an epitaxial structure 4 includes the single-layer nitride film structure and further includes at least one intermediate layer 215, wherein an aluminum atom concentration of the at least one intermediate layer 215 is greater than or equal to 50 at % and a thickness of the at least one intermediate layer 215 is less than or equal to 10 nm. The at least one intermediate layer 215 and the single-layer nitride film structure are stacked together. As shown in FIG. 4, the at least one intermediate layer 215 could be one layer of the AlN film which is clamped between two of the single-layer nitride film structures. In practice, a number of the at least one intermediate layer 215 could be plural and be alternatively stacked with a plurality of single-layer nitride film structures.

Figure 5:
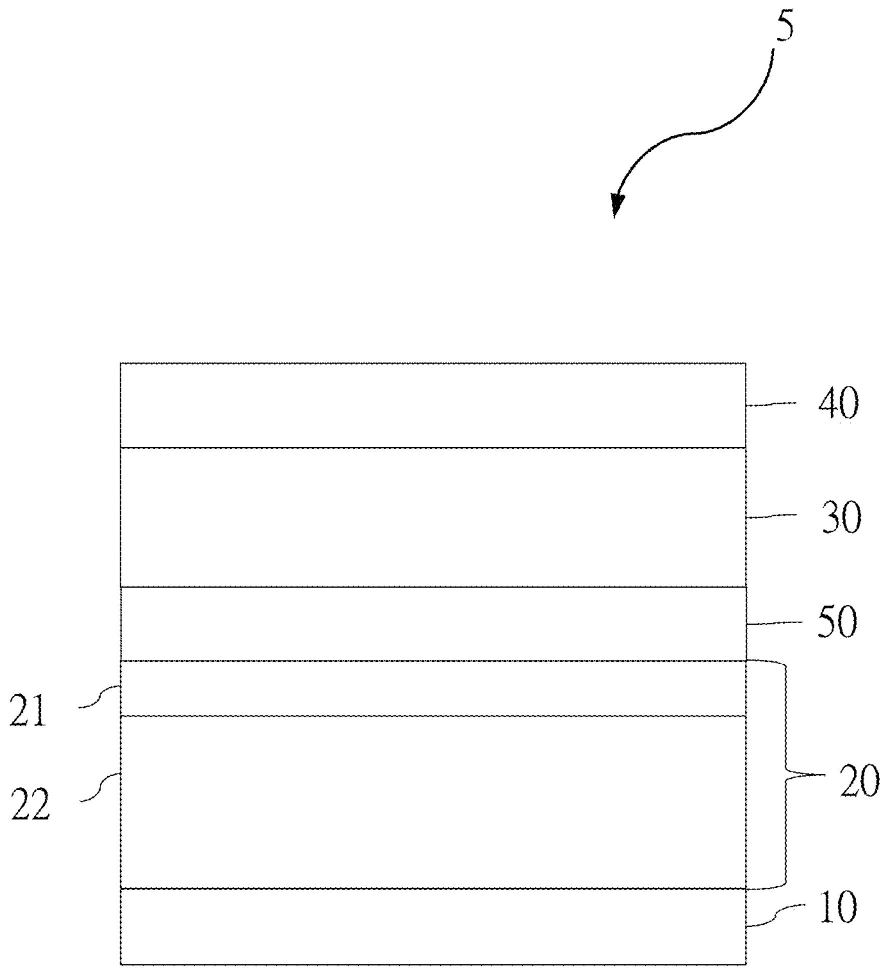
FIG. 5 is a schematic view of the epitaxial structure according to still another embodiment of the present invention.

In still another embodiment, an epitaxial structure 5 is illustrated in FIG. 5 and further includes an intermediate buffer layer 50, wherein the intermediate buffer layer 50 is located between the first buffer layer 20 and the second buffer layer 30. Two opposite sides of the intermediate buffer layer 50 are respectively in contact with the first buffer layer 20 and the second buffer layer 30. An aluminum atom concentration of the intermediate buffer layer 50 is greater than or equal to 50 at %. A thickness of the intermediate buffer layer 50 is less than or equal to 10 nm. The intermediate buffer layer 50 could include AlN and the aluminum atom concentration of the intermediate buffer layer 50 is greater than or equal to 50 at %, so that the effect of stress adjustment could be achieved.

More specifically, in the aforementioned embodiments, a distribution of the aluminum atom concentration of the nitride, which is ternary or above, of the first buffer layer 20 gradually decreases in a direction away from the substrate 10 starting from a side of the first buffer layer 20 being in contact with or near the substrate 10, wherein the gradual decrease of the distribution of the aluminum atom concentration of the nitride, which is ternary or above, of the first buffer layer 20 could be stepped or continuous.

In the aforementioned embodiment, as a current value of the epitaxial structure 3 is equal to $1\times10^{-4}$ A/cm$^2$, a value of a vertical voltage resistance of the epitaxial structure 3 is greater than or equal to 900 V. A comparative example 1, an embodiment 1, and an embodiment 2 are explained for illustration as below.

Figure 6:
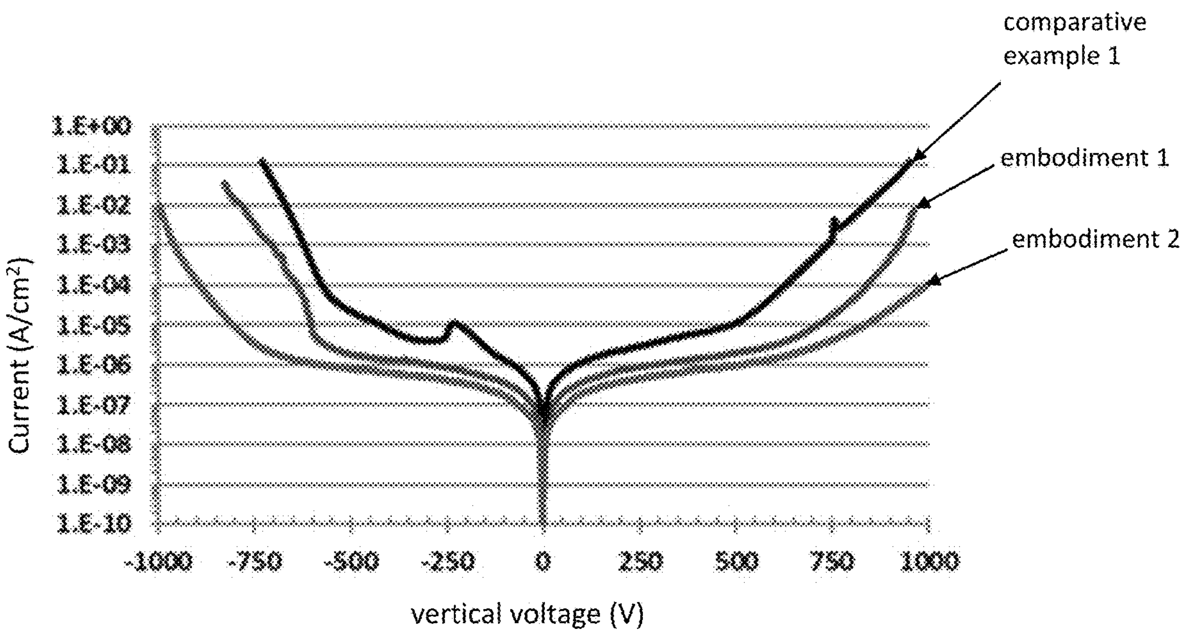
FIG. 6 is a schematic view, showing electrical measurements of the epitaxial structure according to a comparative example 1, an embodiment 1, and an embodiment 2 of the present invention.

An epitaxial structure of the comparative example 1 is almost the same as the epitaxial structure 3 of the embodiment shown in FIG. 3, except that the first portion 21 of the comparative example 1 is undoped. The epitaxial structure 3 of the embodiment 1 is the same as the structure shown in FIG. 3, wherein the first portion 21 of the embodiment 1 has the carbon doping concentration greater than or equal to $1\times10^{18}$ cm$^{-3}$. As shown in FIG. 6, the epitaxial structure 3 of the embodiment 1 has a better performance of voltage resistance; during a forward scan or a reverse scan of a voltage, an absolute value of a current of the embodiment 1 is less than an absolute value of a current of the comparative example 1. It can be seen that, through the first portion 21 having the carbon doping concentration greater than or equal to $1\times10^{18}$ cm$^{-3}$, the performance of voltage resistance of the epitaxial structure could be effectively enhanced.

Figure 7:
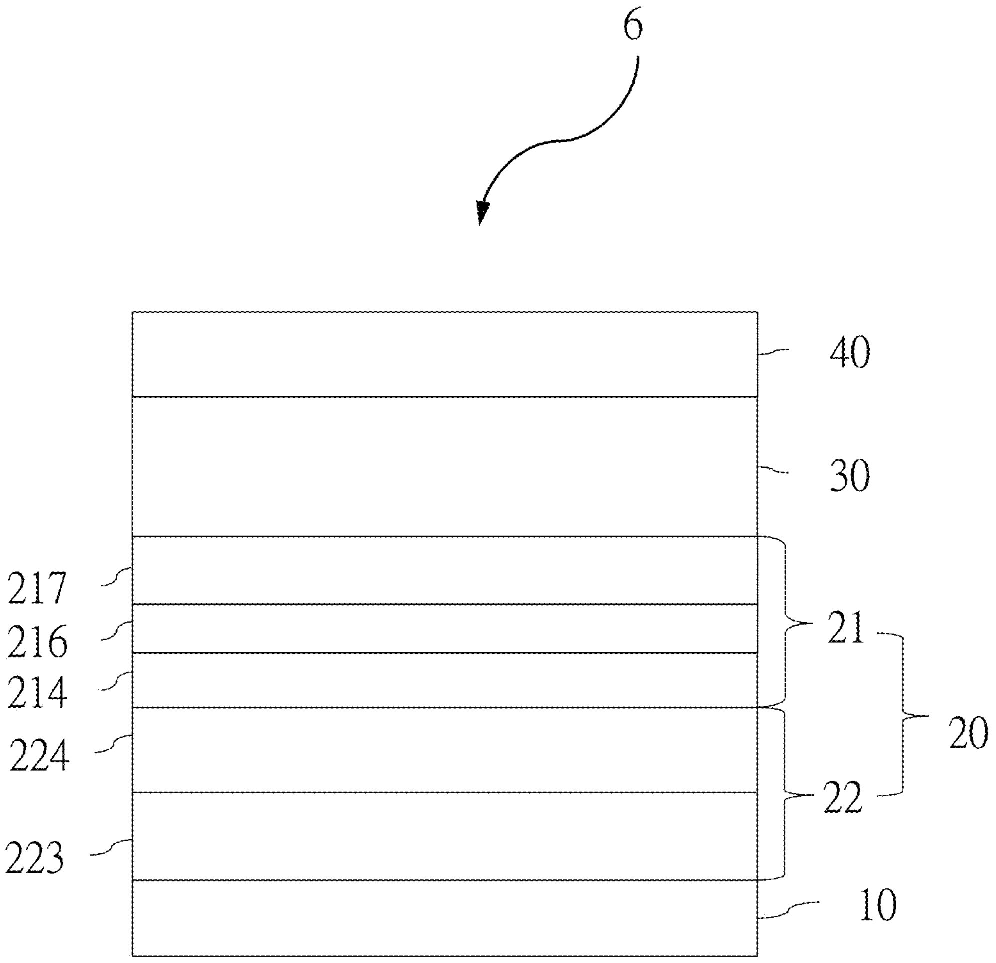
FIG. 7 is a schematic view of the epitaxial structure according to still another embodiment of the present invention.

An epitaxial structure 6 of the embodiment 2 is illustrated in FIG. 7 and is almost the same as the epitaxial structure 3 of the embodiment as shown in FIG. 3, except that the first portion 21 of the epitaxial structure 6 of the embodiment 2 includes not only the superlattice layer 214, but also a sixth aluminum-gallium nitride film structure 216 with an aluminum atom concentration of 18 at % and a seventh aluminum-gallium nitride film structure 217 with an aluminum atom concentration of 7 at %. As shown in FIG. 6, the epitaxial structure 6 of the embodiment 2 has a better performance of voltage resistance; during the forward scan or the reverse scan of the voltage, an absolute value of a current of the embodiment 2 is less than the absolute value of the current of the comparative example 1 and the absolute value of the current of the embodiment 1. In other words, increasing a thickness of the first portion 21 could effectively improve the performance of voltage resistance of the epitaxial structure.

With the aforementioned design, the first portion includes the nitride, which is ternary or above, and the aluminum atom concentration of the nitride of the first portion is less than or equal to 25 at % and the first portion has the element doping and the doping concentration of the element doping is greater than or equal to $1\times10^{18}$ cm$^{-3}$, so that adjusting stress and greatly enhancing a performance of voltage resistance of the epitaxial structure could be achieved.

It must be pointed out that the embodiments described above are only some preferred embodiments of the present invention. All equivalent structures which employ the concepts disclosed in this specification and the appended claims should fall within the scope of the present invention.

What is claimed is:

1. An epitaxial structure, comprising:

a substrate;

a first buffer layer located on a top of the substrate and comprising a first portion, wherein the first portion comprises a nitride which is ternary or above; an aluminum atom concentration of the nitride of the first portion is less than or equal to 25 at %; the first portion has an element doping, wherein a doping concentration of the element doping of the first portion is greater than or equal to 1×1018 cm-3;

a second buffer layer located on a top of the first buffer layer, wherein the second buffer layer is provided without aluminum and has an element doping; and a channel layer located on a top of the second buffer layer;

wherein the first buffer layer comprises a second portion located between the substrate and the first portion; two opposite sides of the second portion are respectively in contact with the substrate and the first portion, an aluminum atom concentration of the second portion is greater than 25 at %;

wherein the second portion does not have an element doping.

2. The epitaxial structure as claimed in claim 1, wherein the first portion is in contact with the second buffer layer.

3. The epitaxial structure as claimed in claim 1, wherein a ratio of a thickness of the first buffer layer to a thickness of the second buffer layer is greater than or equal to 1.5 and is less than or equal to 10.

4. The epitaxial structure as claimed in claim 1, wherein a doping element of the first portion is carbon, iron, or magnesium.

5. The epitaxial structure as claimed in claim 1, further comprising an intermediate buffer layer located between the first buffer layer and the second buffer layer, wherein two opposite sides of the intermediate buffer layer are respectively in contact with the first buffer layer and the second buffer layer; an aluminum atom concentration of the intermediate buffer layer is greater than or equal to 50 at %; a thickness of the intermediate buffer layer is less than or equal to 10 nm.

6. The epitaxial structure as claimed in claim 1, wherein the first portion comprises at least one nitride film structure which has the nitride.

7. The epitaxial structure as claimed in claim 1, wherein the first portion comprises at least one nitride film structure which has the nitride.

8. The epitaxial structure as claimed in claim 1, wherein the first portion comprises a superlattice layer; the superlattice layer comprises at least one ternary or above nitride film and at least one binary nitride film which are alternatively stacked; the at least one ternary or above nitride film has the nitride.

9. The epitaxial structure as claimed in claim 1, wherein the first portion comprises a superlattice layer; the superlattice layer comprises at least one ternary or above nitride film and at least one binary nitride film which are alternatively stacked; the at least one ternary or above nitride film has the nitride.

10. The epitaxial structure as claimed in claim 1, wherein when a current value of the epitaxial structure is equal to 1×10-4 A/cm2, a value of a vertical voltage resistance of the epitaxial structure is greater than or equal to 900 V.

11. The epitaxial structure as claimed in claim 1, wherein a distribution of the aluminum atom concentration of the nitride, which is ternary or above, of the first buffer layer gradually decreases in a direction away from the substrate starting from a side of the first buffer layer being in contact with the substrate.

12. The epitaxial structure as claimed in claim 1, wherein a distribution of the aluminum atom concentration of the nitride, which is ternary or above, of the first buffer layer gradually decreases in a direction away from the substrate starting from a side of the first buffer layer being in contact with the substrate.

13. The epitaxial structure as claimed in claim 2, wherein a distribution of the aluminum atom concentration of the nitride, which is ternary or above, of the first buffer layer gradually decreases in a direction away from the substrate starting from a side of the first buffer layer being in contact with the substrate.

14. The epitaxial structure as claimed in claim 3, wherein a distribution of the aluminum atom concentration of the nitride, which is ternary or above, of the first buffer layer gradually decreases in a direction away from the substrate starting from a side of the first buffer layer being in contact with the substrate.

15. The epitaxial structure as claimed in claim 4, wherein a distribution of the aluminum atom concentration of the nitride, which is ternary or above, of the first buffer layer gradually decreases in a direction away from the substrate starting from a side of the first buffer layer being in contact with the substrate.

16. The epitaxial structure as claimed in claim 5, wherein a distribution of the aluminum atom concentration of the nitride, which is ternary or above, of the first buffer layer gradually decreases in a direction away from the substrate starting from a side of the first buffer layer being in contact with the substrate.

17. The epitaxial structure as claimed in claim 6, wherein the first portion comprises at least one intermediate layer; an aluminum atom concentration of the at least one intermediate layer is greater than or equal to 50 at %; a thickness of the at least one intermediate layer is less than or equal to 10 nm; the at least one intermediate layer and the at least one nitride film structure are alternatively stacked.

18. The epitaxial structure as claimed in claim 6, wherein a distribution of the aluminum atom concentration of the nitride, which is ternary or above, of the first buffer layer gradually decreases in a direction away from the substrate starting from a side of the first buffer layer being in contact with the substrate.

19. The epitaxial structure as claimed in claim 7, wherein the first portion comprises at least one intermediate layer; an aluminum atom concentration of the at least one intermediate layer is greater than or equal to 50 at %; a thickness of the at least one intermediate layer is less than or equal to 10 nm; the at least one intermediate layer and the at least one nitride film structure are alternatively stacked.

20. The epitaxial structure as claimed in claim 7, wherein a distribution of the aluminum atom concentration of the nitride, which is ternary or above, of the first buffer layer gradually decreases in a direction away from the substrate starting from a side of the first buffer layer being in contact with the substrate.

21. The epitaxial structure as claimed in claim 8, wherein a distribution of the aluminum atom concentration of the nitride, which is ternary or above, of the first buffer layer gradually decreases in a direction away from the substrate starting from a side of the first buffer layer being in contact with the substrate.

22. The epitaxial structure as claimed in claim 9, wherein a distribution of the aluminum atom concentration of the nitride, which is ternary or above, of the first buffer layer gradually decreases in a direction away from the substrate starting from a side of the first buffer layer being in contact with the substrate.

23. The epitaxial structure as claimed in claim 9, wherein a distribution of the aluminum atom concentration of the nitride, which is ternary or above, of the first buffer layer gradually decreases in a direction away from the substrate starting from a side of the first buffer layer being in contact with the substrate.

* * * * *